(12) United States Patent
Muller et al.

(10) Patent No.: US 6,357,034 B1
(45) Date of Patent: Mar. 12, 2002

(54) DATA COMMUNICATION METHOD AND THE USE OF THE METHOD IN A SYSTEM FOR REMOTELY READING METERS

(75) Inventors: Marc Muller, Clamart; Patrick Moreau, Le Chesnay; Philippe Godlewski, Paris, all of (FR)

(73) Assignee: Schlumberger Industries, S.A., Montrouge (FR)

( * ) Notice: Subject to any disclaimer, the term of this patent is extended or adjusted under 35 U.S.C. 154(b) by 0 days.

(21) Appl. No.: 09/232,576

(22) Filed: Jan. 16, 1999

(30) Foreign Application Priority Data

Feb. 21, 1998 (FR) ............................................. 98 00591

(51) Int. Cl.$^7$ ............................................. H03M 13/00
(52) U.S. Cl. ...................................... 714/784; 714/746
(58) Field of Search ................................. 714/784, 701, 714/746; 375/240

(56) References Cited

U.S. PATENT DOCUMENTS

| | | | | |
|---|---|---|---|---|
| 5,185,819 A | * | 2/1993 | Ng et al. ....................... 382/56 |
| 5,289,277 A | * | 2/1994 | Blanchard et al. ........... 348/441 |
| 5,313,464 A | * | 5/1994 | Reiff ............................. 714/701 |
| 6,031,871 A | * | 2/2000 | Immink ........................ 375/240 |

\* cited by examiner

Primary Examiner—Phung M. Chung
(74) Attorney, Agent, or Firm—Leonard W. Pojunas (57) ABSTRACT

A method of communicating data in a system having a plurality of transmitters each adapted to transmit a radio signal, and a receiver situated at a distance from the transmitters to receive and process the signals transmitted by the transmitters, information for transmission being subdivided into N-bit symbols, the method consisting in:

giving a numerical value to each symbol; and compressing the data using a CHIP encoding technique in which the values of the symbols are transposed to an encoded value having x digits in a base B, each digit subsequently being represented in the form of n chips, the base B, the number n of chips, and the number x of digits for an encoded value satisfying the following conditions:

$$B \leq 2v \text{ and } 2N \leq B^x$$

so that the total number of chips x.n representing the coded value is less than 2.N.

15 Claims, 7 Drawing Sheets

| ID | CAT | FRAU | REG | NET | GROW |
|----|-----|------|-----|-----|------|

FIG.3

| ID | CAT | END | CH | GROW | DAT |
|----|-----|-----|----|------|-----|

FIG.4

| S1 | S2 | S3 | ... | S14 | S15 | S16 | R1 | R2 | R3 | R4 | R5 |
|----|----|----|-----|-----|-----|-----|----|----|----|----|----|

| SYMBOL VALUE ON 5 BITS | VALUE IN BASE 6 | | SYMBOL VALUE ON 5 BITS | VALUE IN BASE 6 | |
|---|---|---|---|---|---|
| 0 | 1 | 1 | 16 | 3 | 6 |
| 1 | 1 | 2 | 17 | 3 | 7 |
| 2 | 1 | 3 | 18 | 5 | 1 |
| 3 | 1 | 5 | 19 | 5 | 2 |
| 4 | 1 | 6 | 20 | 5 | 3 |
| 5 | 1 | 7 | 21 | 5 | 5 |
| 6 | 2 | 1 | 22 | 5 | 6 |
| 7 | 2 | 2 | 23 | 5 | 7 |
| 8 | 2 | 3 | 24 | 6 | 1 |
| 9 | 2 | 5 | 25 | 6 | 2 |
| 10 | 2 | 6 | 26 | 6 | 3 |
| 11 | 2 | 7 | 27 | 6 | 5 |
| 12 | 3 | 1 | 28 | 6 | 6 |
| 13 | 3 | 2 | 29 | 6 | 7 |
| 14 | 3 | 3 | 30 | 7 | 1 |
| 15 | 3 | 5 | 31 | 7 | 2 |

FIG.7

|   | s | a | b | c |
|---|---|---|---|---|
| 1 | 0 | 0 | 1 | 0011 |
| 2 | 0 | 1 | 0 | 0101 |
| 3 | 0 | 1 | 1 | 0110 |
| 5 | 1 | 0 | 1 | 1100 |
| 6 | 1 | 1 | 0 | 1010 |
| 7 | 1 | 1 | 1 | 1001 |

DATA COMMUNICATION METHOD AND THE USE OF THE METHOD IN A SYSTEM FOR REMOTELY READING METERS

The present invention relates to a communications method in a system having a plurality of transmitters each suitable for transmitting a radio signal, and a receiver situated remotely from the transmitters to receive and process the signals transmitted by the transmitters, where the data to be transmitted is subdivided into N-bit symbols. The invention applies in particular to a system for remotely reading meters.

BACKGROUND OF THE INVENTION

Systems are known having a plurality of transmitters transmitting radio signals that are received by a receiver that is situated remotely. In particular, U.S. Pat. No. 4,799,059 describes a remote reading system in which, after receiving a "wakeup" signal transmitted by the receiver, each transmitter transmits a radio signal including data relating to a water, gas, or electricity meter. The data comprises in particular a preamble, an identity number, a fraud parameter, values for measured parameters, and the type of measuring instrument.

According to the teaching of that document, the data to be transmitted is encoded using a Bose, Chaudhuri, Hocquenghem (BCH) error-correcting code which is applied to all or part of the preamble used, in particular by the receiver to ensure that the message it has received does indeed come from a transmitter of the system. The data is presented in the form of bits, and is encoded by a Manchester encoder which transposes the string of bits into a string of chips that are more suitable for transmission.

In above-mentioned U.S. Pat. No. 4,799,059, the number of bits allocated to data concerning the measurement instrument and to the measured parameters is equal to fifty-four, to which five bits are added that are reserved for possible growth of the message. With preamble sequences that are twenty-one bits long and a sixteen-bit long sequence generated by the BCH error-correcting code, the total number of bits in a message is equal to ninety-six.

However, it is advantageous to be able to lengthen the message that is to be transmitted, and thus increase the number of bits making it up. It may be desired to add data making it possible to provide better management of received messages, for example information about the location of the measurement instrument, or indeed to improve the precision of the measured parameters.

However lengthening the message to be transmitted raises a problem of degrading system performance, due in particular to an increase in the number of collisions between messages from different transmitters. When two messages from two different transmitters are received simultaneously by the receiver, at worst the receiver cannot process the messages at all, and at best it must process messages that include errors.

OBJECTS AND SUMMARY OF THE INVENTION

The present invention relates to a method of communicating data in a system having a plurality of transmitters, each suitable for transmitting a radio signal, and a receiver situated remotely from the transmitters to receive and process the signals transmitted by the transmitters, the data to be transmitted being subdivided into N-bit symbols and enabling the probability of collision between two frames coming from different transmitters to be reduced, other things being equal, and in particular for equal numbers of data bits. In other words, the invention makes it possible to decrease the occupancy of a radio channel. According to the invention, the invention consisting in:

giving a numerical value to each symbol; and compressing the data using a chip encoding technique in which the values of the symbols are transposed to an encoded value having x digits in a base B, each digit subsequently being represented in the form of n chips, the base B, the number n of chips, and the number x of digits for an encoded value satisfying the following conditions:

$$B \leq 2^n \text{ and } 2^N \leq B^x$$

so that the total number of chips x.n representing the coded value is less than 2.N.

In a preferred implementation, the digits forming the encoded value are represented by equal numbers of 1 chips and of 0 chips. That makes it possible to avoid any DC components coming from the string of transmitted chips, by obtaining a mean value of zero from the distribution of value 1 chips and value 0 chips. The performance of the system, and in particular the performance of signal reception is thus improved.

In a particular implementation, each symbol has five bits, the base B is base 6, and the number n of chips is equal to four. Under such circumstances, a symbol encoded in the form of chips using the teaching of the prior art would be transmitted on ten chips, whereas in accordance with the invention, it is transmitted on eight chips.

In a particular implementation, the digits of base 6 are selected, in increasing order, to be equal to 1, 2, 3, 5, 6, and 7. This particular selection simplifies implementation of the binary conversion that generates the chips to be transmitted.

In a particular implementation, the processing of the signals received by the receiver includes a step of matched filtering.

In a preferred implementation, an error-correcting code is applied to the data to be transmitted. Using such an error-correcting code makes it possible to decrease the message error rate (MER), i.e. the ratio between the number of messages that are wrongly received to the total number of messages received during a given period of time. Furthermore, using an error-correcting code increases the probability of success concerning reading data after processing. Communication reliability is thus increased. This makes it possible to reduce the rate at which a given transmitter transmits a message. Consequently the lifetime of the batteries that may be required for transmitter operation is increased, and the number of collisions is also decreased. Advantageously, the error-correcting code is a Reed-Solomon code.

In a particular implementation, the Reed-Solomon code is defined in the Galois body GB(32).

Advantageously, the Reed-Solomon error-correcting code is a short code having the following parameters [S=21, K=16, d=6]. S represents the number of symbols processed; K represents the number of symbols to which the Reed-Solomon error-correcting code is applied; and d is the minimum code distance in the Galois body under consideration and is equal to S−K+1. In the Galois body GB(32), S can be equal at most to thirty-one. Using a short code avoids uselessly lengthening the transmitted frame while conserving performance compatible with the intended application.

In an advantageous implementation, the processing of the signals received by the receiver includes a step of giving a reliability index to each symbol during a data decompression step.

In theory, applying a Reed-Solomon error-correcting code makes it possible to correct a maximum number of errors equal to E[(d−1)/2], where E is the integer portion operator and d is the minimum code distance in the Galois body under consideration. In the particular case of a short code having the parameters [21, 16, 6], the number of errors that can be corrected is equal to two. However, as explained in greater detail in the description below, by using reliability indices, it is possible to correct up to five errors.

In a preferred implementation, a preamble is added to the beginning of a frame of encoded and compressed data, the preamble comprising a signal level sequence and a synchronization sequence. The synchronization sequence of the preamble is of the Turyn type with aperiodic correlation. Preferably, this synchronization sequence is 00000000111001010110010.

In a particular implementation, the radio signals are transmitted continuously by the transmitters in the form of bursts transmitted successively with a pseudo-random period. Under such circumstances, the system is said to be a "one-way" system in that the receivers are not suitable for transmitting signals, and the transmitters are not suitable for receiving signals.

The method of the invention is advantageously applied to a system for remotely reading meters, which meters may, for example, be water, gas, electricity, or heating meters.

In a particular implementation, the data to be transmitted is subdivided, in this order, into: an identity field; a category field; a fraud field; a register field; a network field; and a growth field.

In another particular implementation, the data to be transmitted is subdivided, in this order, into: an identity field; a category field; an end field; a channel field; a growth field; and a data field.

BRIEF DESCRIPTION OF THE DRAWINGS

By way of non-limiting indication, the following description refers to the accompanying drawings, in which.

MORE DETAILED DESCRIPTION

Figure 1:
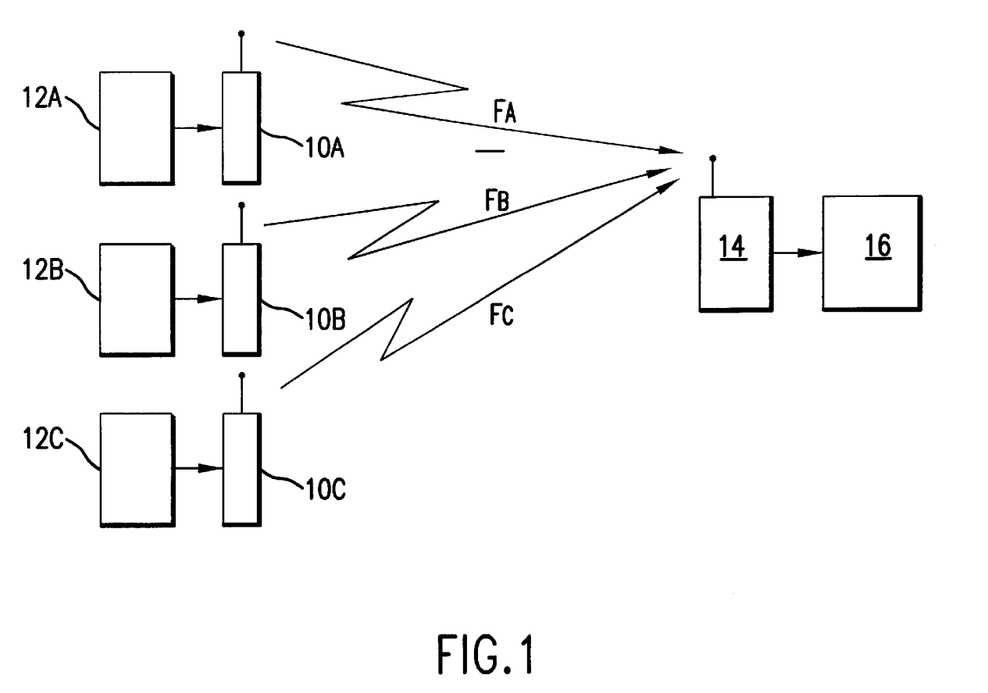
FIG. 1 is a diagram of a system implementing the method of the invention.

As can be seen in FIG. 1, a system implementing the method of the invention comprises a plurality of transmitters 10A–10C each suitable for transmitting a radio signal. In the example shown, each transmitter 10A–10C is connected to a measuring instrument 12A–12C which may be a meter for metering water, gas, electricity, or indeed heating. The parameters measured by the measuring instrument are given to the transmitter. These parameters together with other data relating to the measuring instrument, and/or the transmitter, and/or the system is processed for transmission in the form of amplitude modulation of a radio signal.

The system described is a "one-way" system, i.e. each transmitter 10A–10C continuously transmits a burst signal with a pseudo-random period, e.g. having a mean time period T lying in the range two seconds to eight seconds. Departures from said mean period make it possible to desynchronize in time the bursts coming from two transmitters at the same moment. The system could also be of the "one-and-a-half-way" type in which a signal wakes up radio transmission activity by the transmitters.

The frequency FA-FC of the radio signal transmitted by each transmitter 10A–10C is pseudo-random and lies in a determined frequency band, e.g. 902 MHz to 928 MHz.

Each burst from a given transmitter is therefore transmitted by a signal at a frequency which is different from the preceding frequency, thus having the effect of considerably reducing the possibility of two transmitters transmitting bursts at the same moment and at the same frequency twice in succession. In a system for remotely reading measuring instruments, as shown in FIG. 1, the measuring instruments 12A–12C are read by a receiver 14 which may be fixed or stationary in the coverage zone of the transmitters 10A–10C.

The receiver 14 receives and processes the radio signals transmitted by the transmitters so as to provide data concerning the measuring instruments 12A–12C and the parameters measured thereby to processor means 16 which, for example, perform statistical operations, billing, or any other type of processing that may be appropriate for proper management of a set of meters.

Although the data to be transmitted needs to be processed in quasi-real time by the transmitters 10A–10C, the operations of reception and processing as performed by the receiver 14 can be decoupled: for example, the receiver 14 can receive and store the data carried by the radio signals, and process it in deferred manner.

Figure 2A:
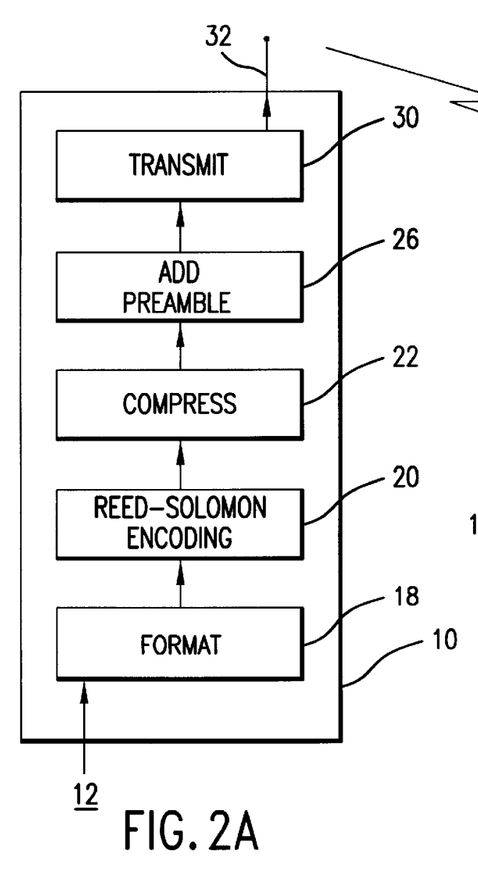
FIGS. 2A and 2B are diagrams showing the steps of the method of the invention implemented by a transmitter and by a receiver, respectively.
Figure 2B:
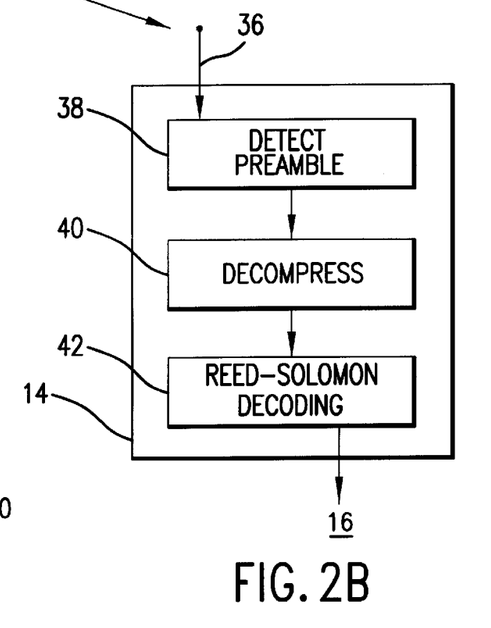

FIGS. 2A and 2B are diagrams showing the various steps in the communications method of the invention. FIG. 2A is a diagram showing the steps implemented in a transmitter 10, it being understood that these steps are identical for all of the transmitters in the system.

In a step 18, the data received by the transmitter 10 from the measuring instrument 12 is initially formatted as a series of fields, which operation may possibly be performed by the measuring instrument 12 itself.

Figure 3:
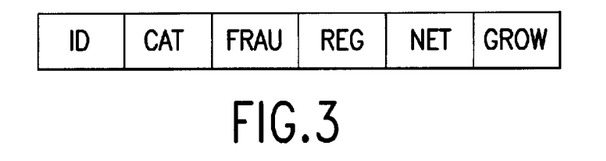
FIG. 3 is a diagram of a string of data fields.

FIG. 3 is a diagram of a string of fields suitable for use with meters. By way of example, the data to be transmitted may be made up of eighty bits spread over six fields:

ID: an identity field made up of thirty-two bits, for example; it represents the identity number of the transmitter and/or the meter to which it is connected;

CAT: a category field made up of eight bits, for example; it represents the type of meter (water, gas, electricity, or other meter), the reading format (binary or hexadecimal), and possibly also characteristics of the transmitter (e.g. high or low transmission power);

FRAU: a fraud field made up of eight bits, for example; it indicates whether a fraud has been committed, such as an unauthorized attempt to manipulate the meter or the transmitter; it may also contain information concerning the number of frauds that have been committed;

REG: a register field made up of twenty-four bits, for example; it gives the value of the measured parameter;

NET: a network field made up of two bits, for example; it specifies whether the transmitter is connected to a single meter or to a plurality of meters connected together in a network; and GROW: a growth field made up of six bits, for example, and reserved for possible growth in the arrangement of the data; the growth field may include the additional bits that might possibly be necessary to enable the data to be divided evenly into N-bit symbols, in other words to ensure that there is an integer number of N-bit symbols.

Figure 4:
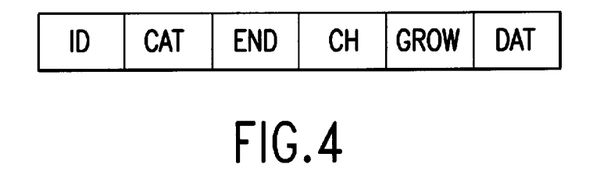
FIG. 4 is a diagram of another string of data fields.

FIG. 4 is a diagram of another string of fields suitable for use with meters. The data to be transmitted is made up of eighty bits, for example, spread over six fields:

ID: an identity field on thirty-two bits, for example;

CAT: a category field on eight bits, for example;

END: an end field made up of one bit, for example, taking the value 0 so long as the field is not part of the last packet to be transmitted on a given frequency, and taking the value 1 when the field is part of the last packet transmitted on a given frequency;

CH: a channel field made up of six bits, for example; it gives the number of the radio channel used;

GROW: a growth field made up of one bit, for example; and

DAT: a data field made up of thirty-two bits, for example, and giving the values of the measured parameters.

In the implementation shown in FIG. 2A, the string of bits is subdivided into symbols. Each symbol is made up of N bits, where N is equal to five, for example. Under such circumstances, the string of eighty bits corresponds to sixteen symbols.

The following step 20 consists in applying an error-correcting code to the string of bits. By way of example the error-correcting code is a Reed-Solomon code. The theory of Reed-Solomon error-correcting codes is known, and is described, for example, in the work entitled "Digital communications" written by John D. Proakis, published by McGraw-Hill International Editions in the computer science series.

The Reed-Solomon error-correcting code used is, for example, a short code defined on the Galois body GB(32) with the following parameters [S=21, K=16, d=6]. The choice of parameters is a compromise between the number of bits to be transmitted and the number of errors to be corrected in order to obtain an MER that is deemed to be acceptable. The sixteen symbols are represented in the form of the following polynomial:

$$u(y)=u_{15}y^{20}+u_{14}y^{19}+ \ldots +u_1y^6+u_0y^5$$

where y represents the value and $u_{15}, \ldots, u_0$ represent the associated amplitudes belonging to the set [0, 31].

The code generator polynomial g(y) is written:

$$g(y)=(y-\beta^{-2})(y-\beta^{-1})(y-\beta^{-0})(y-\beta^{+1})(y-\beta^{+2})$$

where β is the primitive root of the polynomial:

$$y^5+y^2+1=0.$$

The form of the generator polynomial stems from the Galois body selected.

Applying the Reed-Solomon error-correcting code specifies redundancy symbols which can be used on reception to detect and correct errors that have occurred in the composition of the symbols during transmission.

Redundancy symbols are obtained by dividing the polynomial u(y) by the generator polynomial g(y). The remainder r(y) from said division is a polynomial of degree 4, and code words c(y) are thus obtained that can be written in polynomial form:

$$c(y)=u(y)+r(y)$$

which makes it possible to deduce five redundancy symbols.

Figure 5:
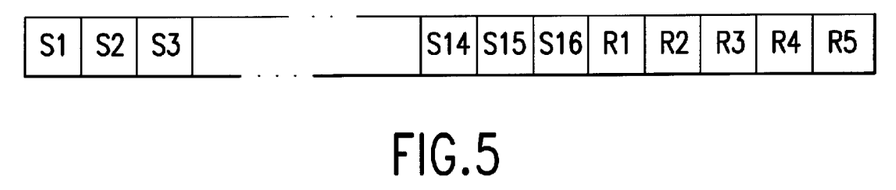
FIG. 5 is a diagram of a string of symbols.

The Reed-Solomon error-correcting code makes it possible to perform systematic encoding enabling code words to be written in the form of a string of sixteen symbols S1–S16 to which the Reed-Solomon code has been applied, and a string of five redundancy symbols R1–R5, as shown in FIG. 5. In the presently described example, the redundancy symbols also possess five bits each.

Following step 22 (FIG. 2A) is constituted by compression as described in greater detail below with reference to FIG. 6. The compression consists in causing each symbol from the Reed-Solomon encoding to correspond to a predefined value represented in the form of a certain number of chips. The notion of a "chip" is explained in greater detail in the above-mentioned work written by John G. Proakis.

Each symbol has five bits, so there exist thirty-two ($2^5$) different symbols which are caused to correspond to respective values in the range 0 to 31. Thus, in step 23, the corresponding value is given to each symbol from the Reed-Solomon encoding.

In step 24, each value obtained in this way is transposed into a coded value having x digits in a base B.

During step 25, each digit forming part of the coded values is represented in the form of n chips.

The base B, the number x of digits making up a value encoded in base B, and the number n of chips satisfy the following conditions $$B \leq 2n$$

and $$2^N \leq B^x$$

so that the total number of chips x.n representing the value encoded in base B is less than 2.N.

In the presently described implementation, base B is selected as being base 6, the number x as being equal to 2, and the number n of chips is preferably selected to be even, e.g. equal to 4.

Figure 7:
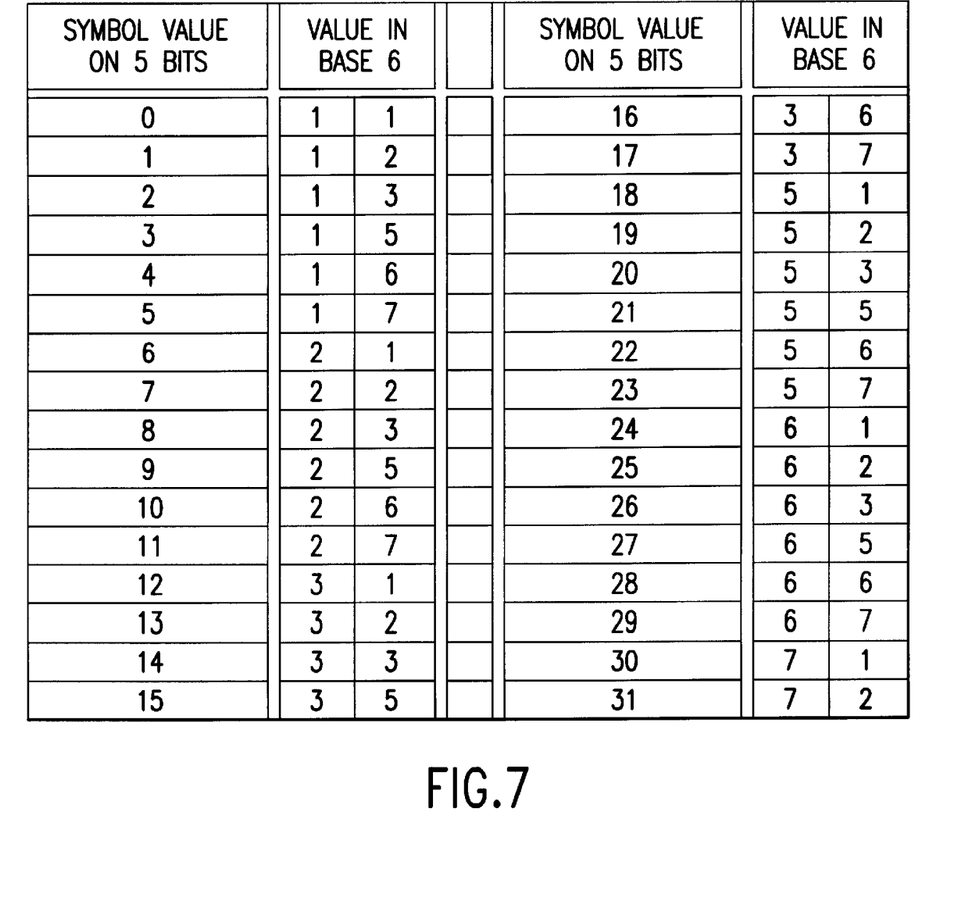
FIG. 7 is a correspondence table between symbol values in base 10 and in base 6 as used in the invention.

The table of FIG. 7 shows the correspondence given to each of the values 0 to 31 when encoded using two digits (x=2) in base 6. In this table, the digits 1, 2, 3, 5, 6, and 7 are preferred to the usual representation 0, 1, 2, 3, 4, 5.

Figure 8:
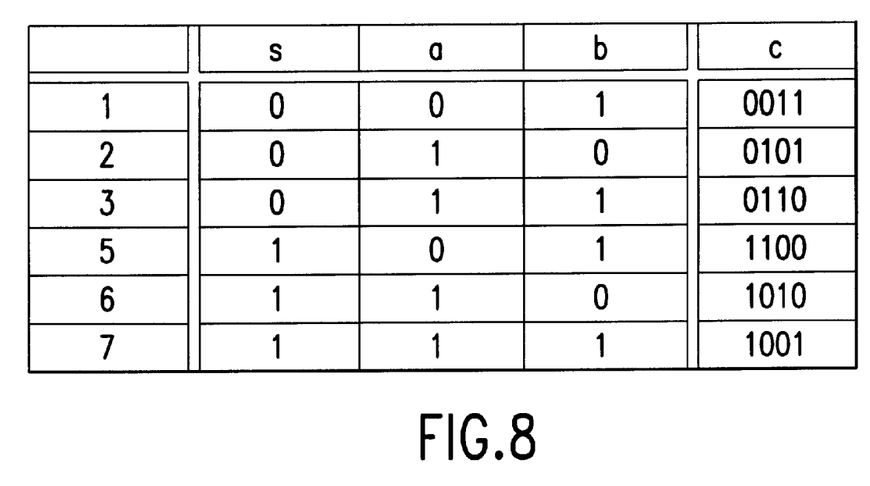
FIG. 8 is a correspondence table between the base 6 digits and the way they are encoded on four chips in accordance with the invention.

The table of FIG. 8 shows the digits in base 6 encoded on four chips. To obtain this result, three base vectors u, v, and w are used that can be represented antipodally and orthogonally:

u=1111
v=0101
w=0011 z is the expression on four chips of the digit and it is obtained by performing the following operation:

$$z=s.u \oplus a.v \oplus b.w$$

where s, a, and b are three bits of the binary representation of the digit concerned.

By performing these operations, each symbol is thus encoded on eight chips. In practice, a correspondence table can give each table from the Reed-Solomon encoding its value as encoded on eight chips.

By using ordinary chip encoding, as in the prior art, each bit of a symbol is encoded on two chips, thus giving rise to a symbol being encoded on ten chips.

With reference again to FIG. 2A, following step 26 consists in adding a preamble ahead of the string of chips representing the symbols. By way of example, the preamble comprises thirty-two bits, each bit being encoded on two chips, with, for example, bit 0=(chip 0, chip 1) and bit 1=(chip 1, chip 0).

Figure 9:
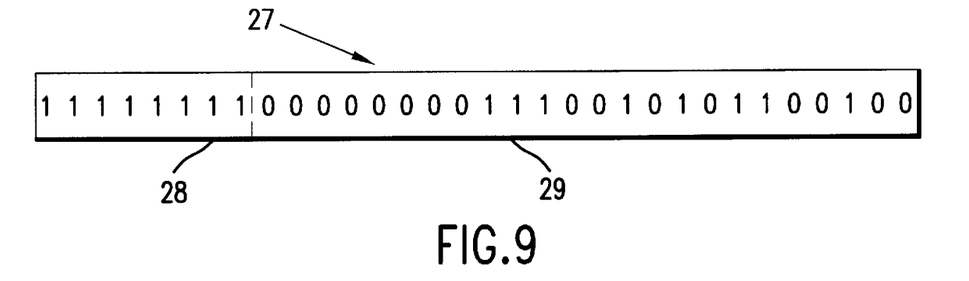
FIG. 9 is a diagram of a preamble as used in an implementation of the invention.

FIG. 9 is a diagram of an implementation of the preamble 27 prior to being encoded in chip form. The preamble has a first sequence 28, e.g. of eight bits that are all equal. In FIG. 9, these bits have been selected equal to 1, but they could have been selected equal to 0. The sequence 28 makes it possible for the receiver to detect that a message is being transmitted and also makes it possible to calibrate signal level. A second sequence 29 of twenty-four bits, for example, follows the first sequence 28 and is of the Turyn type, named for its inventor. A general description of this type of sequence is to be found in the article by R. Turyn entitled "Sequence with small correlation" published in the work "Error-correcting codes", Proceedings of a Symposium at the University of Wisconsin, Madison, May 6–8, 1968, published by Henry B. Mann, John Wiley & Sons, New York, 1968. Finally, in the implementation described, a message is obtained that is made up of a preamble comprising sixty-four chips followed by a string of symbols comprising one hundred twenty-eight chips, itself followed by a string of redundancy symbols comprising forty chips, giving a total of two hundred thirty-two chips to be transmitted.

Again with reference to FIG. 2A, following step 30 consists in transmitting the message. The transmitter continuously transmits radio signal bursts, each burst carrying updated messages as the parameters from the meter are modified.

Figure 10:
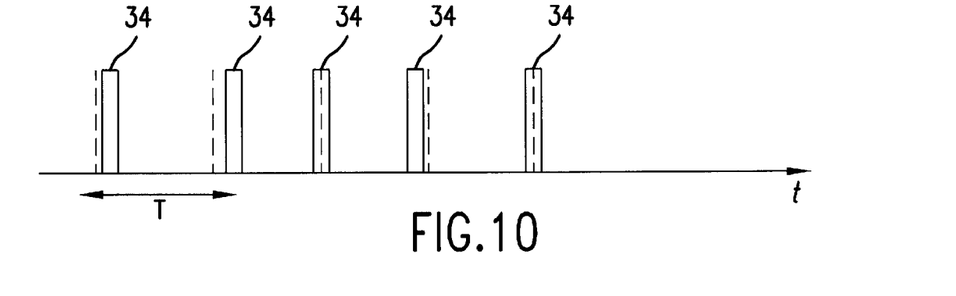
FIG. 10 is a diagram showing a string of bursts transmitted by a transmitter in a particular implementation of the method of the invention.

FIG. 10 is a diagram of a string of bursts 34 transmitted by a transmitter. The bursts 34 are not separated in time by a fixed period but by a period which varies in pseudo-random manner about a mean value T, for example lying in the range two to eight seconds.

Similarly, the frequency of the signal varies pseudo-randomly from one burst to another over a frequency band extending, for example, from 902 MHz to 928 MHz.

Since each transmitter is independent of the others and since they all operate in the same manner, this technique reduces the probability of a given radio channel being occupied at the same time by two bursts coming from two different transmitters.

Figure 11:
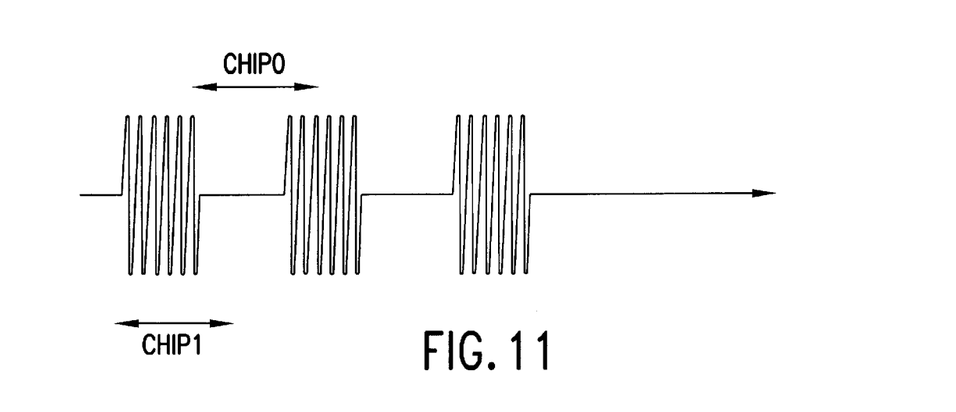
FIG. 11 is a diagram showing a string of the chips 101010.

FIG. 11 is a diagram of a string of chip 101010 carried by the radio signal. The message is transmitted in the form of on/off amplitude modulation. For example, chip 1 is transmitted by modulating the signal and chip 0 by no modulation. Chip transmission duration is 30.5 $\mu$s, for example.

When a receiver 14 is in the coverage area of a transmitter 10, it picks up the radio signal via its antenna 36. The various stages of receiving and processing the signal are described below with reference to FIG. 2B. Given that the frequency of the signal lies in a radio band, the signal carrying the transmitted message is mixed with a quantity of other signals coming from radio telephones, broadcast transmitters, transducers for actuating garage doors, or indeed alarm systems. So far as the receiver 14 is concerned, these signals are interference, and in step 38 it takes account only of signals having a preamble of the form described above. Preamble detection also makes it possible to synchronize the processing performed by the receiver 14 with the received signal. The following operations are performed only on the message symbols after the preamble has been stripped off.

Decompression, step 40, is performed on each half-symbol. In the example described above, compression is such that eight chips correspond to a value that is encoded in base 6. Thus, a half-symbol is represented by four chips, and the arrangement thereof is necessarily to be found in the sets of four chips shown in the table of FIG. 8 (column z).

Figure 12:
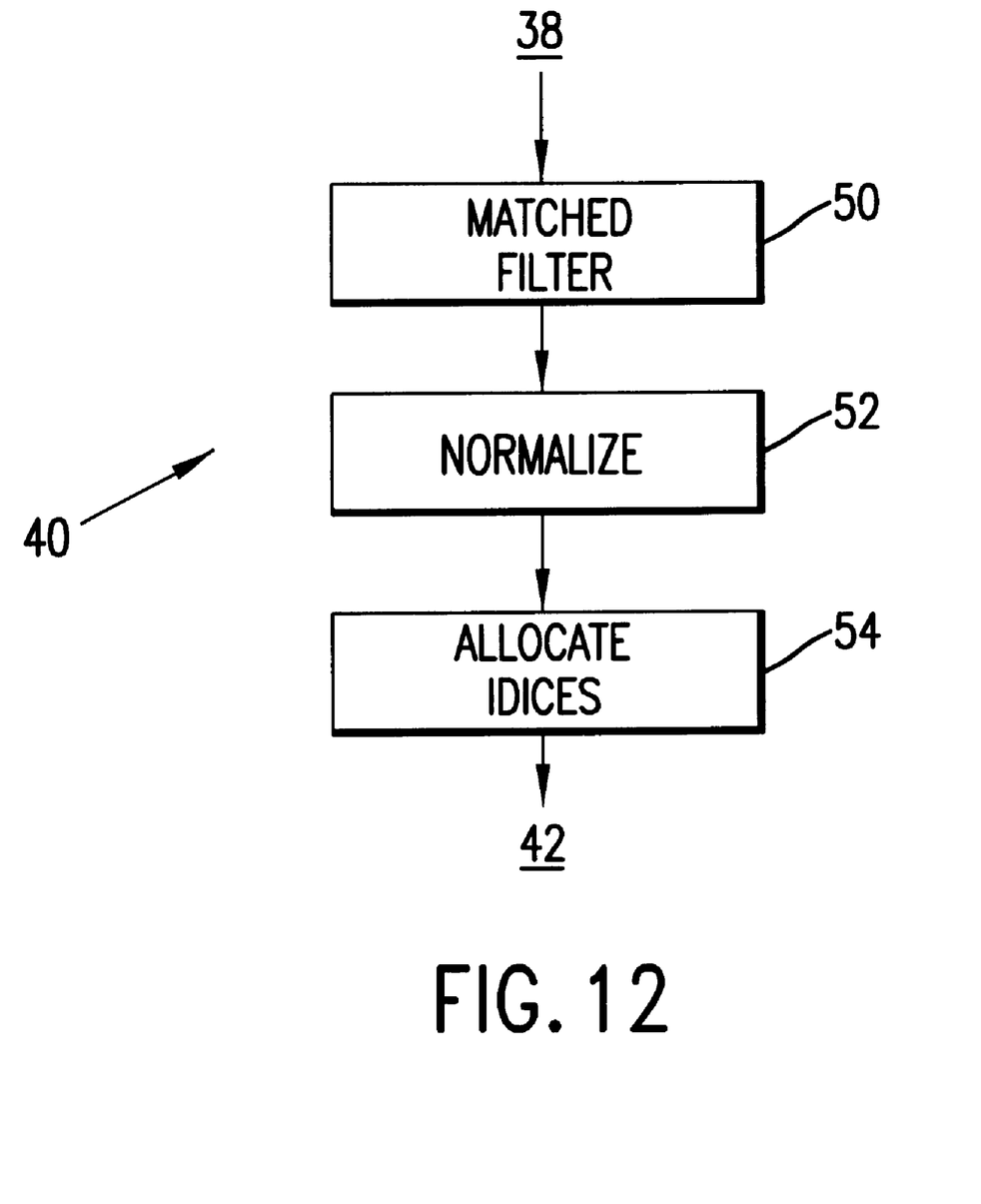
FIG. 12 is a diagram showing the steps of decompression in accordance with the invention.

FIG. 12 is a diagram showing the decompression steps. Decompression 40 comprises matched filtering 50, normalization of output values 52, and allocation of reliability indices 54.

Step 50 is thus constituted by matched filtering. Such filtering is described in general terms in the above-mentioned work by John G. Proakis. In the example described above, there matched filters FA(1), FA(2), and FA(3) are used, associated with a fourth filter FA(4) representing the energy of the set of four chips under consideration. The matched filters are defined as follows:

$$FA(1)=+Z(1)+Z(2)-Z(3)-Z(4)$$

$$FA(2)=+Z(1)-Z(2)+Z(3)-Z(4)$$

$$FA(3)=+Z(1)-Z(2)-Z(3)+Z(4)$$

$$FA(4)=+Z(1)+Z(2)+Z(3)+Z(4)$$

where $Z(i)$, for $1 \leq i \leq 4$ represents the energy measured by the receiver 14 for chip number i.

In the table of FIG. 8, it can be seen that the digit 5 corresponds to the four chips 1100, the digit 6 to the chips 1010, the digit 7 to the chips 1001. For FA(1), FA(2), and FA(3), the signs + or − ahead of the energies correspond respectively to chip 1 and to chip 0 for each of the digits 5, 6, and 7. FA(4) corresponds to the sum of the energies, i.e. the total energy received by the receiver 14 for the string of four chips under consideration.

In equivalent manner, the matched filters can be defined on the basis of encoding for digits 1, 2, and 3 (FIG. 8).

FA(1), FA(2), and FA(3) are normalized relative to FA(4) in step 52. The normalized output values of the matched filter are therefore:

$$F^*(1)=FA(1)/FA(4)$$

$$F^*(2)=FA(2)/FA(4)$$

$$F^*(3)=FA(3)/FA(4)$$

When the receiver 14 processes a half-symbol, it therefore calculates the values of $F^*(1)$, $F^*(2)$, and $F^*(3)$, and determines an index $i_m$ ($1 \leq i_m \leq 3$) for which the absolute value of $F^*(i_m)$ is the greatest.

The base 6 digit corresponding to the string of four received chips is therefore equal to:

$$i_m \text{ if } F^*(i_m)<0$$

or $$i_m+4 \text{ if } F^*(i_m)>0$$

The synchronized processing performed by the receiver 14 makes it possible to pair the half-symbols received correctly and consequently to pair the two base 6 digits which are deduced therefrom.

Figure 6:
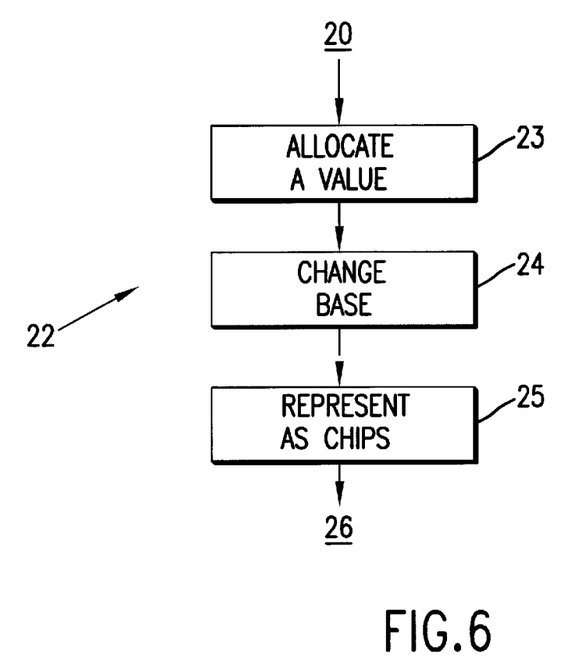
FIG. 6 is a diagram of the steps of compression performed in accordance with the invention.

The value encoded in base 6 as calculated from the received chips makes it possible to retrieve the value of the symbol merely by correspondence in a table that is identical to that of FIG. 6.

The symbol encoded on five bits is obtained from said value merely by correspondence.

Each of these symbols has a reliability index allocated thereto in step 5.4.

The reliability indices are determined from the normalized matched filters. A weight is calculated for each received half-symbol, as encoded on four chips in the example described. For this purpose, the first and second maxima $M_1$ and $M_2$ of the absolute values of the normalized output values from the matched filters are determined. The weight $W'$ of the half-symbol in question is then: $W'=M_1-M_2$.

Because the processing is synchronized, the receiver 14 determines the weight $W''$ of the half-symbol which forms a symbol with the preceding half-symbol.

The reliability index W of the symbol in question is then equal to the smaller of the weights $W'$ and $W''$, i.e.:

$$W=\mathrm{Min}(W', W'')$$

Decompression step 40 thus makes it possible to obtain each symbol, regardless of whether it corresponds to a data symbol or to a redundancy symbol, with the symbol being encoded on five bits in the example described. The reliability index W is then added to each symbol. By way of example, this index W may be encoded on two bits, thus providing four values corresponding to the estimated probability that the symbol in question has been properly received by the receiver 14. W equal to 00 means that the symbol is certainly erroneous, whereas W equal to 11 means that it is unlikely that the symbol in question is erroneous.

Returning to FIG. 2B, following step 42 consists in detection and error-correction performed by applying Reed-Solomon decoding to all of the symbols coming from the decompression.

Errors are searched for in the frame by calculating syndromes. There are five syndromes when the short code is used with the parameters [21, 16, 6]. The work by S. Lin and D. I. Costello, Jr. (1983) entitled "Error control coding fundamentals and applications" published by Prentice-Hall, Englenwood Cliffs, N.Y., USA, describes in general terms how syndromes are calculated and used for detecting and correcting errors.

The receiver 14 looks to see whether the frame in question has zero, one, or two errors, where two is the theoretical maximum number of errors that can be processed using the short code with parameters [21, 16, 6]. If the receiver detects more than two errors, the frame is not rejected, but the receiver 14 makes use of the reliability indices in an attempt to correct the frame. As mentioned above, the system is capable of correcting five errors. To reduce the probability of the case arising where the processing performed gives rise to a solution which is acceptable to the receiver but does not correspond to the message that was actually transmitted, the processing is limited to two additional cases making it possible sometimes to correct up to four errors. If after all the various processing has been performed, the receiver 14 detects that errors remain, the frame is rejected and consequently not forwarded to the processing means 16.

The receiver 14 thus calculates syndromes. If they are all zero, the frame does not have any error and it is forwarded to the processing means 16.

When the syndromes are not all zero, the receiver 14 checks whether the syndromes have determined ratios:

$$SY_2/SY_1=SY_1/SY_0=SY_0/SY_{-1}=SY_{-1}/SY_{-2}$$

where $SY_{-2}$, $SY_{-1}$, $SY_0$, $SY_1$, $SY_2$ represent the calculated syndromes.

If the above relationship applies between the syndromes, then the frame has one error only, and it can be located and its value can be deduced. It is shown that under such circumstances, the position p of the error is equal to:

$$p=\log_\beta(SY_2/SY_1)$$

where $\beta$ is the root of the above-mentioned generator polynomial and the value of the error is equal to $S_0$. The receiver 14 corrects the frame and recalculates the syndromes which should now be zero. If that is the case, the receiver 14 forwards the corrected frame to the processing means 16.

When the above-mentioned relationship is not true, or if the syndromes are not zero after recalculation, then the receiver 14 searches to see whether the frame in question has two errors.

One error corresponds to two unknowns: the position of the error and its value. Two errors therefore correspond to four unknowns. The five syndromes make it possible under such circumstances to establish a non-linear system of five equations in four unknowns. The additional equation is used to verify that the results obtained by solving the system comprising the other four equations are correct. If so, the receiver 14 corrects the frame and recalculates the syndromes which should be zero. If so, the receiver 14 forwards the corrected frame to the processing means 16.

Otherwise, where the above calculation does not give a solution or if the results obtained do not satisfy the fifth equation, or indeed if the syndromes are not zero after recalculation, then the frame has more than two erroneous symbols, and under normal use of Reed-Solomon decoding the frame would be rejected. Nevertheless, the receiver 14 implementing the method of the invention makes use of the previously calculated reliability indices in an attempt to correct the frame.

For this purpose, the four symbols having the lowest reliability indices are deleted by the receiver 14, it being understood that if the number of low value reliability indices is greater than four, the frame is in any event rejected. The term "low value reliability index" is used to mean, for example, indices of value less than three if the indices are coded on four values. Since the positions in which deletions have taken place are known, this operation gives rise to four unknowns which are the real values of the deleted syndromes. The receiver 14 solves a system of five equations in four unknowns that stem from calculating the syndromes.

As before, after the system of equations have been solved, the receiver 14 recalculates the syndromes which will be zero if the errors have been corrected. Under such circumstances, the receiver forwards the corrected frame to the processing means 16. It will be understood that giving reliability indices makes it possible to reduce the number of unknowns by assuming that the lowest reliability indices are given to erroneous symbols whose positions are therefore known.

Otherwise, or if the system of equations does not have a solution, the receiver 14 deletes the two symbols having the lowest reliability indices. A search is then made to see whether the frame has any error in addition to the deletions by solving the system of five equations in four unknowns (position and value for the error, positions of the two deletions).

If the system can be solved and if the syndromes recalculated after correction are zero, then the receiver 14 forwards the corrected frame to the processing means 16. Otherwise, the frame is rejected.

A transmitter 10 suitable for implementing the method of the invention is constituted mainly by a microprocessor having a non-volatile memory, e.g. of the E²PROM type, and a read/write memory (RAM) for storing values. The microprocessor is programmed appropriately to implement the method, which is easily done by the person skilled in the art. The microprocessor is connected to the communications interface module having conventional means for generating, modulating, and transmitting a radio signal via the antenna 32, see FIG. 2A.

An appropriate receiver 14 for implementing the method of the invention is mainly constituted by a communications interface module having an antenna 36 (see FIG. 2B) and conventional means for receiving and filtering radio signals lying in a determined frequency band. This module then delivers the selected signal to a microprocessor associated with conventional memories, or to a computer. The person skilled in the art can easily program the microprocessor or the computer.

The above description is given mainly with reference to an application of remotely reading meters, however it can be applied in similar manner to any type of system that operates in analogous manner, for example a remote surveillance or security system. The measuring instruments are then presence detectors, and the transmitted data corresponds to the location of the detector and to the parameters it has measured. The receiver can then be connected to a security point which will raise an alarm if an abnormal presence is detected. The quality of the information transmitted is different but the communications method of the present invention applies in similar manner.

What is claimed is:

1. A method of communicating data in a system having a plurality of transmitters each adapted to transmit a radio signal, and a receiver situated at a distance from the transmitters to receive and process the signals transmitted by the transmitters, information for transmission being subdivided into N-bit symbols, the method consisting in:

giving a numerical value to each symbol; and compressing the data using a CHIP encoding technique in which the values of the symbols are transposed to an encoded value having x digits in a base B, each digit subsequently being represented in the form of n chips, the base B, the number n of chips, and the number x of digits for an encoded value satisfying the following conditions:

$B \leq 2^n$ and $2^N \leq B^x$ so that the total number of chips x.n representing the coded value is less than 2.N.

2. A method according to claim 1, in which the digits forming the coded value are represented by equal numbers of 0 chips and of 1 chips.

3. A method according to claim 1, in which each symbol has five bits, base B is base 6, and the number n of chips is equal to 4.

4. A method according to claim 3, in which the digits x for the values of the symbols coded in base 6 are represented in increasing order by 1, 2, 3, 5, 6, 7.

5. A method according to claim 1, in which the processing of the signals received by the receiver includes a step of matched filtering.

6. A method according to claim 1, consisting in applying an error-correcting code to the data to be transmitted.

7. A method according to claim 6, in which the errors correcting code is a Reed-Solomon code.

8. A method according to claim 7, in which the Reed-Solomon error-correcting is defined in the Galois body GB(32).

9. A method according to claim 8, in which the Reed-Solomon error-correcting code is a short code with the parameters [21, 16, 6].

10. A method according to claim 6, in which the processing of the signals received by the receiver include a step of allocating a reliability index to each symbol.

11. A method according to claim 1, in which the data to be transmitted is placed in a frame having a preamble added to the beginning of the frame of encoded and compressed data, said preamble comprising a signal level sequence and a synchronization sequence equal to: 00000000111001010101100100.

12. A method according to claim 1, in which the radio signals are transmitted continuously by the transmitters in the form of bursts that are transmitted successively with a pseudo-random period.

13. The use of a method according to claim 1 in a system for remote reading of meters.

14. A method according to claim 13, in which the data to be transmitted is subdivided, in this order, into: an identity field; a category field; a fraud field; a register field; a network field; and a growth field.

15. A method according to claim 13, in which the data to be transmitted is subdivided, in this order, into: an identity field; a category field; an end field; a channel field; a growth field; and a data field.

* * * * *